US008969969B2

(12) United States Patent
Chan et al.

(10) Patent No.: US 8,969,969 B2
(45) Date of Patent: Mar. 3, 2015

(54) HIGH THRESHOLD VOLTAGE NMOS TRANSISTORS FOR LOW POWER IC TECHNOLOGY

(75) Inventors: Victor W. C. Chan, Newburgh, NY (US); Narasimhulu Kanike, Wappingers Falls, NY (US); Huiling Shang, Yorktown Heights, NY (US); Varadarajan Vidya, Wappingers Falls, NY (US); Jun Yuan, Fishkill, NY (US); Roger Allen Booth, Jr., Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 899 days.

(21) Appl. No.: 12/727,312

(22) Filed: Mar. 19, 2010

(65) Prior Publication Data

US 2010/0237425 A1    Sep. 23, 2010

Related U.S. Application Data

(60) Provisional application No. 61/161,790, filed on Mar. 20, 2009.

(51) Int. Cl.
*H01L 27/092*    (2006.01)
*H01L 21/8234*   (2006.01)
*H01L 21/8238*   (2006.01)

(52) U.S. Cl.
CPC  *H01L 21/823807* (2013.01); *H01L 21/823412* (2013.01)
USPC .... 257/369; 257/370; 257/372; 257/E21.633; 257/E27.062; 438/217

(58) Field of Classification Search
USPC .......... 257/369, E21.633, E27.062, 370, 372; 438/217
See application file for complete search history.

(56) References Cited

U.S. PATENT DOCUMENTS

| | | | |
|---|---|---|---|
| 5,998,828 A * | 12/1999 | Ueno et al. | 257/315 |
| 6,362,873 B1 | 3/2002 | Facchini et al. | |
| 6,548,842 B1 * | 4/2003 | Bulucea et al. | 257/288 |
| 6,840,640 B2 | 1/2005 | Antoni et al. | |
| 6,858,853 B2 | 2/2005 | Antoni et al. | |
| 6,982,941 B2 | 1/2006 | Yamanoi et al. | |
| 6,992,834 B2 | 1/2006 | Totzeck et al. | |
| 7,077,533 B2 | 7/2006 | Weiser et al. | |
| 7,197,652 B2 | 3/2007 | Keller, Jr. et al. | |
| 7,215,991 B2 | 5/2007 | Besson et al. | |

(Continued)

*Primary Examiner* — Lynne Gurley
*Assistant Examiner* — Vernon P Webb
(74) *Attorney, Agent, or Firm* — Whitham, Curtis, Christofferson & Cook, P.C.; Joseph P. Abate

(57) ABSTRACT

Transistors exhibiting different electrical characteristics such as different switching threshold voltage or different leakage characteristics are formed on the same chip or wafer by selectively removing a film or layer which can serve as an out-diffusion sink for an impurity region such as a halo implant and out-diffusing an impurity such as boron into the out-diffusion sink, leaving the impurity region substantially intact where the out-diffusion sink has been removed. In forming CMOS integrated circuits, such a process allows substantially optimal design for both low-leakage and low threshold transistors and allows a mask and additional associated processes to be eliminated, particularly where a tensile film is employed to increase electron mobility since the tensile film can be removed from selected NMOS transistors concurrently with removal of the tensile film from PMOS transistors.

10 Claims, 7 Drawing Sheets

(56) References Cited

U.S. PATENT DOCUMENTS

| | | |
|---|---|---|
| 7,239,447 B2 | 7/2007 | Goehnermeier et al. |
| 7,326,969 B1 | 2/2008 | Horch |
| 7,341,902 B2 | 3/2008 | Anderson et al. |
| 7,352,435 B2 | 4/2008 | Streefkerk et al. |
| 7,359,036 B2 | 4/2008 | Dodoc |
| 7,360,218 B2 | 4/2008 | Accapadi et al. |
| 7,388,267 B1 | 6/2008 | Chen et al. |
| 2003/0152000 A1 | 8/2003 | Yamanoi et al. |
| 2005/0138442 A1 | 6/2005 | Keller, Jr. et al. |
| 2007/0105299 A1 | 5/2007 | Fang et al. |
| 2007/0141775 A1 | 6/2007 | Teo et al. |
| 2007/0249130 A1 | 10/2007 | Anderson et al. |
| 2008/0020533 A1* | 1/2008 | Thei et al. .................. 438/286 |
| 2008/0064191 A1 | 3/2008 | Teo et al. |
| 2008/0142896 A1 | 6/2008 | Chen et al. |
| 2008/0148274 A1 | 6/2008 | Accapadi et al. |
| 2008/0171423 A1 | 7/2008 | Ieong et al. |

\* cited by examiner

HIGH THRESHOLD VOLTAGE NMOS TRANSISTORS FOR LOW POWER IC TECHNOLOGY

CROSS-REFERENCE TO RELATED APPLICATIONS

This non-provisional application claims the benefit of the provisional application filed with the United States Patent and Trademark Office as Ser. No. 61/161,790 entitled "HIGH THRESHOLD VOLTAGE NMOS TRANSISTORS FOR LOW POWER IC TECHNOLOGY", filed Mar. 20, 2009.

FIELD OF THE INVENTION

The present invention generally relates to low power semiconductor integrated circuit technology and, more particularly, to formation of transistors having low leakage current together with high integration density low power transistors and logic circuitry at very small minimum feature size.

BACKGROUND OF THE INVENTION

Desired increases in performance and functionality of integrated circuits have driven designs to very extremely high integration density and extremely small transistor dimensions. While such designs can offer improvements in feasible clock and switching speed and reduced signal propagation time, power requirements, power dissipation constraints and breakdown resistance for increased numbers of transistors in greater proximity and operating at increased clock speeds has required reduction of switching voltage threshold of transistors used in low power designs.

However, reduction of switching threshold of logic transistors scaled to smaller sizes also decreases the off/on resistance ratio of such transistors since reduction of dimensions of the conduction channel tends to increase "on" resistance while lower control voltages tend to increase leakage and decrease "off" resistance. These deviations from ideal switching characteristics tend to increase the power consumption due to leakage currents and compensation thereof as well as compromising noise immunity and susceptibility to switching errors. Therefore, very recent low power integrated circuit designs have included transistors having reduced leakage and operating at increased switching threshold voltages at strategically located points and/or in particular selected paths in the low power circuits to limit the leakage currents which are characteristic of other aggressively scaled low power transistors forming the preponderance of the circuit elements of the integrated circuit. Only one serially connected transistor of NMOS type is suitable for a majority of such circuit paths.

However, such an approach has been accompanied by increased process complexity and higher cost of manufacture. Specifically, to increase the switching threshold and decrease leakage of selected transistors which are of larger size but otherwise process compatible with smaller, low power transistors, it has been necessary to increase the concentration of so-called halo implants surrounding the conduction channel in the transistors. Doing so has required use of an additional mask which introduces additional process complexity and cost while engendering sources of process error (e.g. overlay and/or lithographic errors) and compromising manufacturing yield.

SUMMARY OF THE INVENTION

It is therefore an object of the present invention to provide a low leakage transistor which is process compatible with aggressively scaled low switching threshold transistors that can be formed without use of a separate mask.

It is another object of the invention to provide an integrated circuit having substantially identical transistor structures but exhibiting significantly different electrical characteristics.

In order to accomplish these and other objects of the invention, an integrated circuit is provided including a plurality of transistors of benchmark design of a first conductivity type and including an out-diffusion sink for impurities in a semiconductor material of the transistors of benchmark design, and at least one transistor of the first conductivity type exhibiting reduced leakage compared with transistors of benchmark design, wherein a total impurity dose in a transistor of benchmark design and in the adjacent out-diffusion sink and an impurity dose in an impurity implant of the at least one transistor are substantially equal.

In accordance with another aspect of the invention, a method of making an semiconductor device having transistors of a first conductivity type but exhibiting different electrical characteristics is provided comprising steps of forming transistors of a first conductivity type having an impurity region containing an impurity which increases a voltage threshold of the transistors, forming a blanket film covering the transistors, removing a portion of the blanket film from at least one selected transistor, and out-diffusing an impurity from the impurity region of transistors of the first conductivity type to remaining portions of the blanket film whereby a voltage threshold of transistors of said first conductivity type other than said at least one selected transistor is reduced.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
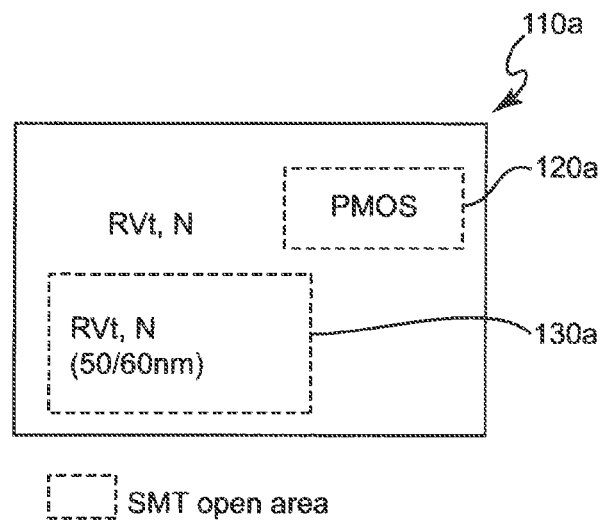
FIGS. 1A and 1B are plan views of exemplary mask portions useful for understanding the invention and potential applications thereof.
Figure 1B:
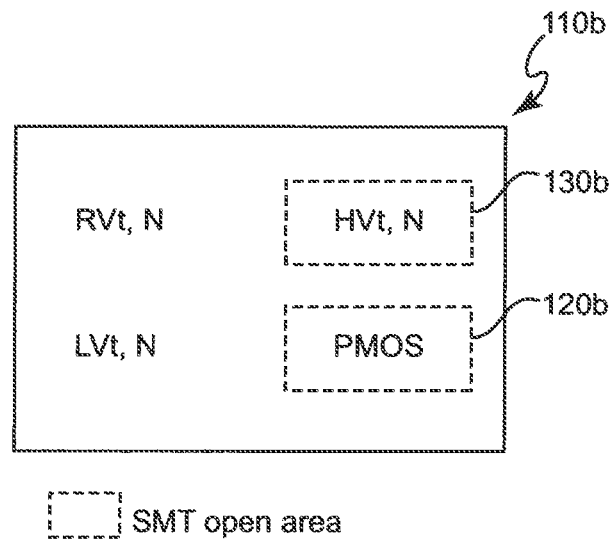

Referring now to the drawings, and more particularly to FIGS. 1A and 1B, there is shown, in plan view, exemplary portions of masks that may be used to implement the invention and which will be helpful in understanding the basic principles of the invention. It should be understood that FIGS.

Figure 2A:
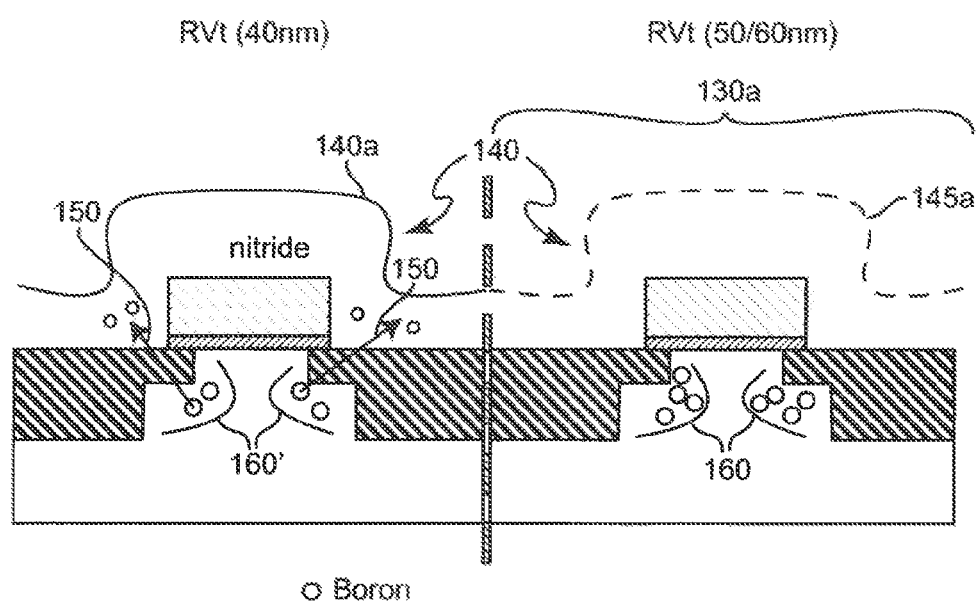
FIG. 2C is a cross-sectional view of two transistors corresponding to the generalized mask section of FIG. 1C, FIGS. 3A and 3B are graphical depictions of the change in on-current, $I_{on}$, and off-current, $I_{off}$, obtained through employment of the embodiment of the invention as illustrated in FIGS. 1A and 2A, FIGS. 4A and 4B are graphical depictions of the change in threshold voltage and $I_{off}$, respectively obtained through employment of the embodiment of the invention as illustrated in FIGS. 1B and 2B.
Figure 2B:
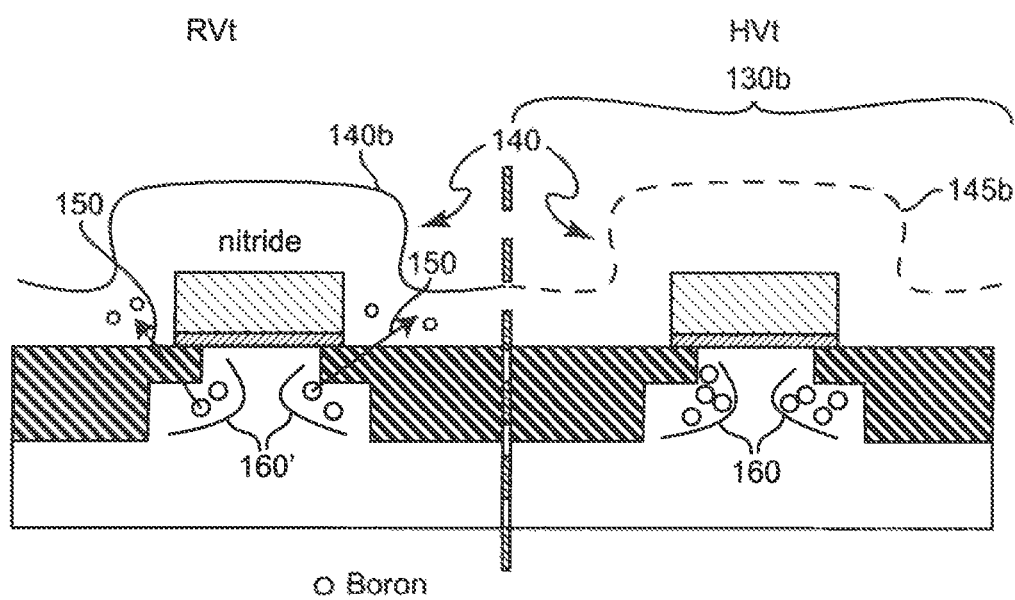
Figure 1C:
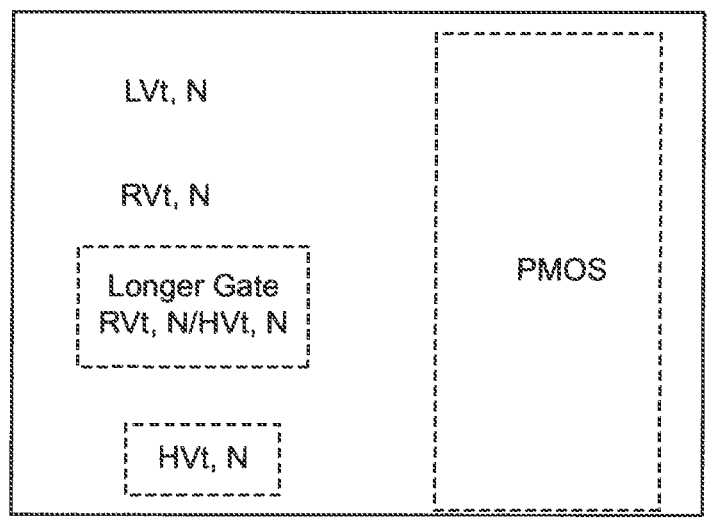
FIG. 1C is a plan view of a more generalized mask portion illustrating a possible combination of FIGS. 1A and 1B, FIGS. 2A and 2B are cross-sectional views of two transistors illustrating a basic principle of operation of the invention.
Figure 2C:
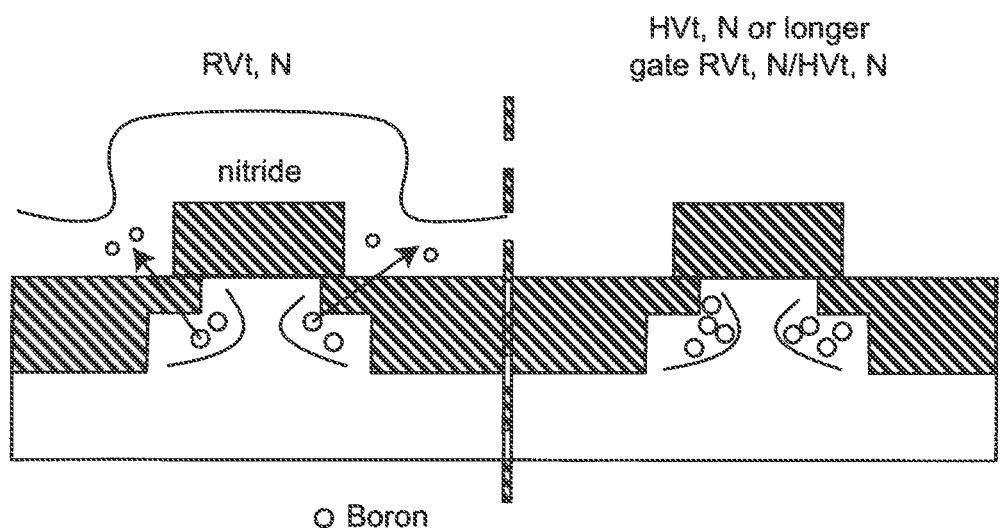

1A and 1B differ only in the types of transistors formed in the respective quadrants of these Figures and that both Figures are intended to illustrate the same principle of application of the invention and that the invention can be applied to any integrated circuit design regardless of the structure and required electrical characteristics of transistors therein as indicated by the generalized illustration of FIG. 1C. FIGS. 2A and 2B provide cross-sectional views of two transistors corresponding to transistors at transistor sites shown in FIGS. 1A and 1B, respectively, and illustrating the same principle of operation of the invention. Thus FIGS. 2A and 2B differ only in the labeling of transistor types at transistor sites therein. Similarly, FIG. 2C includes labels corresponding to the more generalized embodiment corresponding to the mask portion of FIG. 1C. It should be noted that FIG. 1C also illustrates removal of a single portion of the tensile/out-diffusion sink film from all PMOS type transistors together with removal of the tensile/out-diffusion sink film from both longer gate/channel NMOS transistors of benchmark threshold and benchmark gate/channel length, high threshold NMOS transistors. It should be understood, however, that less than all types of transistors shown in FIG. 1C may be included in any particular integrated circuit design and that low leakage transistors preferably include a combination of increased channel length and increased switching threshold as is also illustrated in FIGS. 1C and 2C.

It will be helpful in coming to an appreciation of the invention to review some current practices in transistor design for integrated circuits, particularly where transistors in integrated circuits are aggressively scaled to very small minimum feature sizes approaching the limits of resolution of lithographic processes. As alluded to above, low power integrated circuits are predominantly formed of transistors having a voltage threshold at about one-half the power supply voltage which may be on the order of one volt or less and thus generally exhibit a reduced "off" resistance allowing leakage. Accordingly, to reduce or limit leakage, low power integrated circuits require a transistor having a higher threshold in some paths. However, increase of the threshold voltage of a transistor requires an additional mask to, for example, provide an increased impurity concentration in a halo implant which, in turn, can cause gate induced drain leakage, if excessive.

One known alternative for providing low leakage transistors that does not necessarily require an extra mask is to increase the gate length (e.g. by 25% to 50% such as from 40 nm for the predominant transistor design, often referred to as a "benchmark" design, to 50 to 60 nm for low leakage transistors). However, to be certain that the transistor having increased gate length can be strongly turned off, it is desirable that the transistor have a much higher threshold voltage, $V_{th}$, (often referred to as $V_{th}$ rolloff) than the transistor having the nominal, predominant or benchmark gate length (e.g. 40 nm) which is fixed by the performance requirements of the design. However, normal, known source/drain engineering techniques for producing large $V_{th}$ rolloff degrade other device characteristics such as drain induced barrier lowering (DIBL) and subVt swing and can even cause susceptibility to source-drain punch through. In general, approaches to low leakage transistor designs, as compared with benchmark transistor designs, may involve either greater channel length at a low threshold voltage, a high threshold voltage at benchmark transistor channel length or, preferably, some combination of increased channel length and increased threshold voltage.

In regard to transistor structure design, where transistors are aggressively scaled, it is a known practice to enhance carrier mobility through application of stressed films. A tensile film (commonly a nitride although films of other materials can be used) applied, for example, over a gate structure will apply a compressive force in the gate and, in turn, a tensile force in the transistor channel and improve mobility of electrons which are the majority carrier in NMOS devices. Similarly, a compressive film will apply a tensile force in the gate structure and a compressive force in the transistor channel to improve the mobility of holes which are the majority carrier in PMOS devices. Conversely, a compressive force on the channel will inhibit electron mobility and a tensile force on the channel will inhibit hole mobility. Therefore, a blanket application of a tensile film will require removal of that film at PMOS sites using a mask having openings at PMOS sites while masking NMOS sites; after which a compressive film may be applied at PMOS transistor sites, if desired.

Additionally, for a given integrated circuit (IC) design for a given application, most transistors will be of a single design and/or geometry (sometimes referred to hereinafter as a benchmark size, design or gate length) which can all be formed by a single set of process steps and which are optimized for the intended application of the IC. If two different transistor designs are desired in the IC which cannot be formed by the same process steps, block-out masking and separate process sequences must generally be utilized. If, however, transistors having a different geometry (e.g. 40 nm polysilicon gate length for the optimized predominant type of transistor and a 50 to 60 (50/60) nm polysilicon gate length to, for example, increase off resistance and reduce leakage current for other transistors in this example) but which can be formed by the same process sequence are desired (e.g. as shown in the legends of FIGS. 1A and 2A) or transistors of identical geometry but where different electrical characteristics are desired (e.g. as shown by the legends of FIGS. 1B and 2B in which RVt indicates "regular" threshold voltage for the predominant number of transistors, LVt indicates a reduced threshold voltage compared to RVt and HVt indicates an increased threshold voltage compared to RVt as would correspond to a lower leakage current), a single process sequence can be used but only one of the transistor geometries, at most, can be optimized and some additional process that requires a mask for selectivity is required to obtain acceptable electrical characteristics for the non-optimized transistor(s).

In FIGS. 1A and 1B, reference numerals 110a and 110b should be understood as an assembly of a substrate or body of semiconductor material having transistors (corresponding to respective labels) already formed thereon and covered by a blanket tensile nitride (or other material) layer or film 140 (TNF) and a mask for selectively removing portions of the tensile layer. The transistors are substantially complete but for gate source and drain connections and include impurity implants formed, for example, by a well-known self-aligned technique and so-called halo implants formed adjacent the source and drain regions and under the sides of the gate structure formed, for example, by well-known angled implantation techniques. If only a single impurity concentration is required for respective impurity implants, neither implantation process necessarily requires a mask other than block-out masking for different impurity types between the NMOS and PMOS transistors. On the other hand, if different impurity concentrations are required for producing transistors having different electrical characteristics, an additional implantation process using an additional mask has been required.

As alluded to above, removing the tensile (e.g. nitride) layer from PMOS transistor sites using mask apertures corresponding to dashed lines 120a, 120b, is conventional. The invention is preferably implemented by modification of the mask to include additional apertures 130a, 130b, at selected NMOS transistor sites, as well, where high threshold, low leakage transistors are to be formed. That is, in FIG. 1A, aperture 130a corresponds to the site of a 50/60 nm gate length NMOS transistor (accordingly labeled RVt,N 50/60 nm)) and, in FIG. 1B at least sites labeled Rvt,N indicate benchmark design transistors having the same geometry and structural and impurity implant design.

The inventors have discovered that for NMOS devices, the tensile (e.g. nitride) layer 140 can serve as a sink for out-diffusion of boron from the halo extension implants 160 of NMOS transistors (indicated by arrow 150 in FIGS. 2A and 2B) without significant adverse effect on the tensile properties thereof or improved electron mobility resulting therefrom. Further, the out-diffusion increases as the concentration of halo implant impurities is increased and the rate of out-diffusion is highly predictable. However, if the sink for boron out-diffusion is removed, as can be done in a single process for removal of the tensile (e.g. nitride) film (TNF) from the PMOS transistor sites using a single, modified (by provision of aperture 130a/130b) mask, out-diffusion in areas where the tensile film has been removed is greatly reduced, if not substantially eliminated; leaving a higher concentration of boron in the halo implant substantially unchanged. By the same token, removal of the tensile film also serves to reduce electron mobility in the transistors located at sites 130a/130b, tending to reduce leakage, as well.

Therefore, in accordance with the invention, a higher concentration of boron impurities which is substantially optimized for high threshold voltage, low leakage transistors may be implanted in an angled implant step common to all NMOS transistors in the IC and reduced to the concentration that is substantially optimized for the predominant or benchmark design transistor by well-controlled out-diffusion into the tensile film at benchmark design transistor sites but leaving the higher impurity concentration substantially intact at sites of low-leakage transistors. Thus, by designing and providing a heavier halo implant impurity dose 160 which may be optimized for the high $V_{th}$, low leakage transistor, providing aperture 130a, 130b, for removal of the tensile (e.g. nitride) film at such locations and the PMOS transistor sites and removing the tensile film as shown at 145a, 145b, (which also reduces electron mobility in those NMOS transistors; further reducing leakage) and heat treatment, out-diffusion of boron into the tensile (e.g. nitride) film can be caused at benchmark transistor sites to reduce the boron concentration in the halo implants 160' to a substantially optimum level in accordance with performance requirements while leaving boron concentration of halo implants at low leakage transistor sites substantially unchanged since there is no remaining tensile (e.g. nitride) film to provide a sink for boron out-diffusion at low leakage transistor sites. In other words, by formation of respective benchmark design and low leakage design transistors in accordance with the invention, the total halo implant impurity dose in the halo implant and out-diffused impurity in the tensile film or respective benchmark design transistors is substantially equal to the halo implant dose in a low-leakage, high threshold transistor. In other words, compared with prior art integrated circuit chips, the overall boron content of a chip will be significantly greater in a chip manufactured in accordance with the invention and substantially that which would be required if all transistors were formed with an increased $V_{th}$ through increased boron concentration in the halo implant (as is, in fact, the case at an intermediate stage of manufacture before the excess boron in benchmark design transistors is out-diffused and rendered ineffective to cause increased $V_{th}$) rather than boron concentration in halo implants being increased only at sites of low leakage design transistors.

Figure 3A:
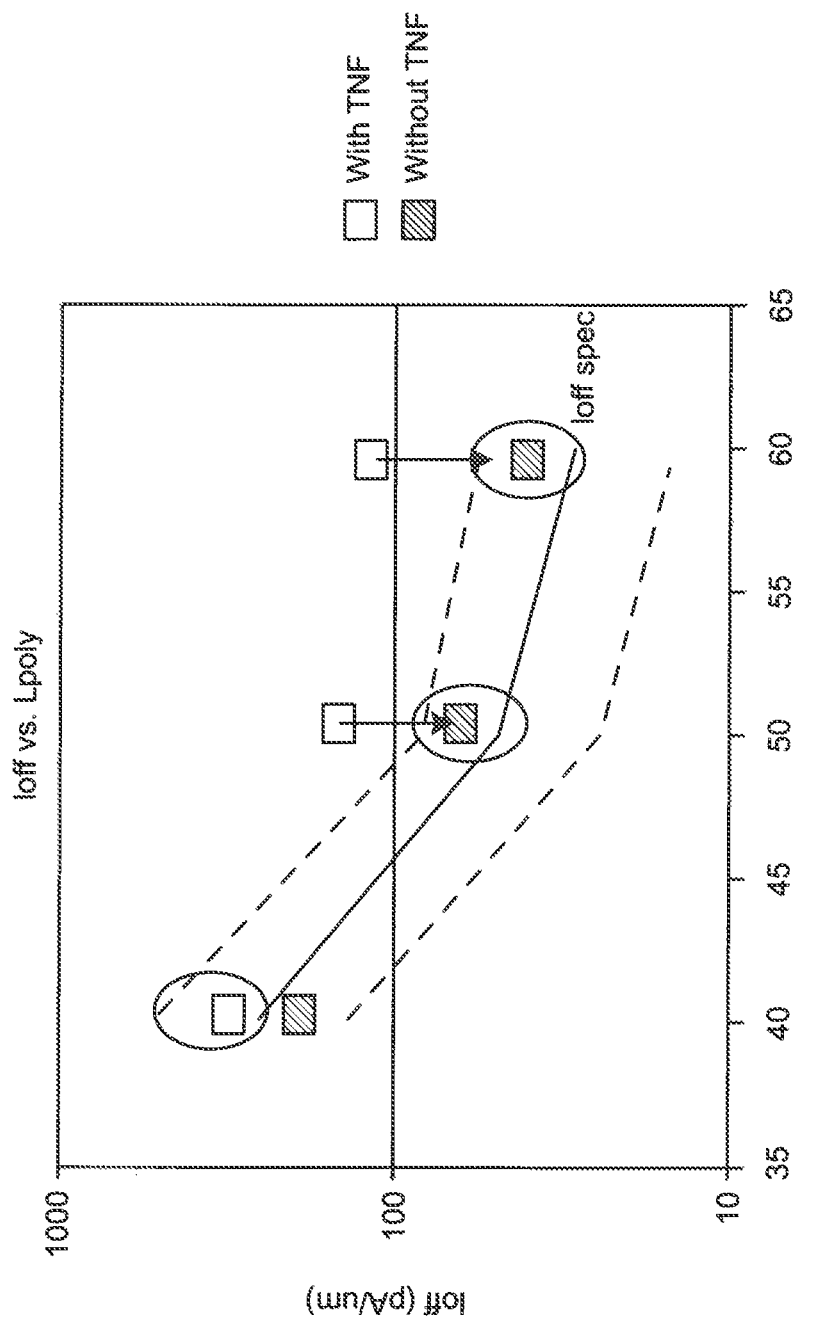
Figure 3B:
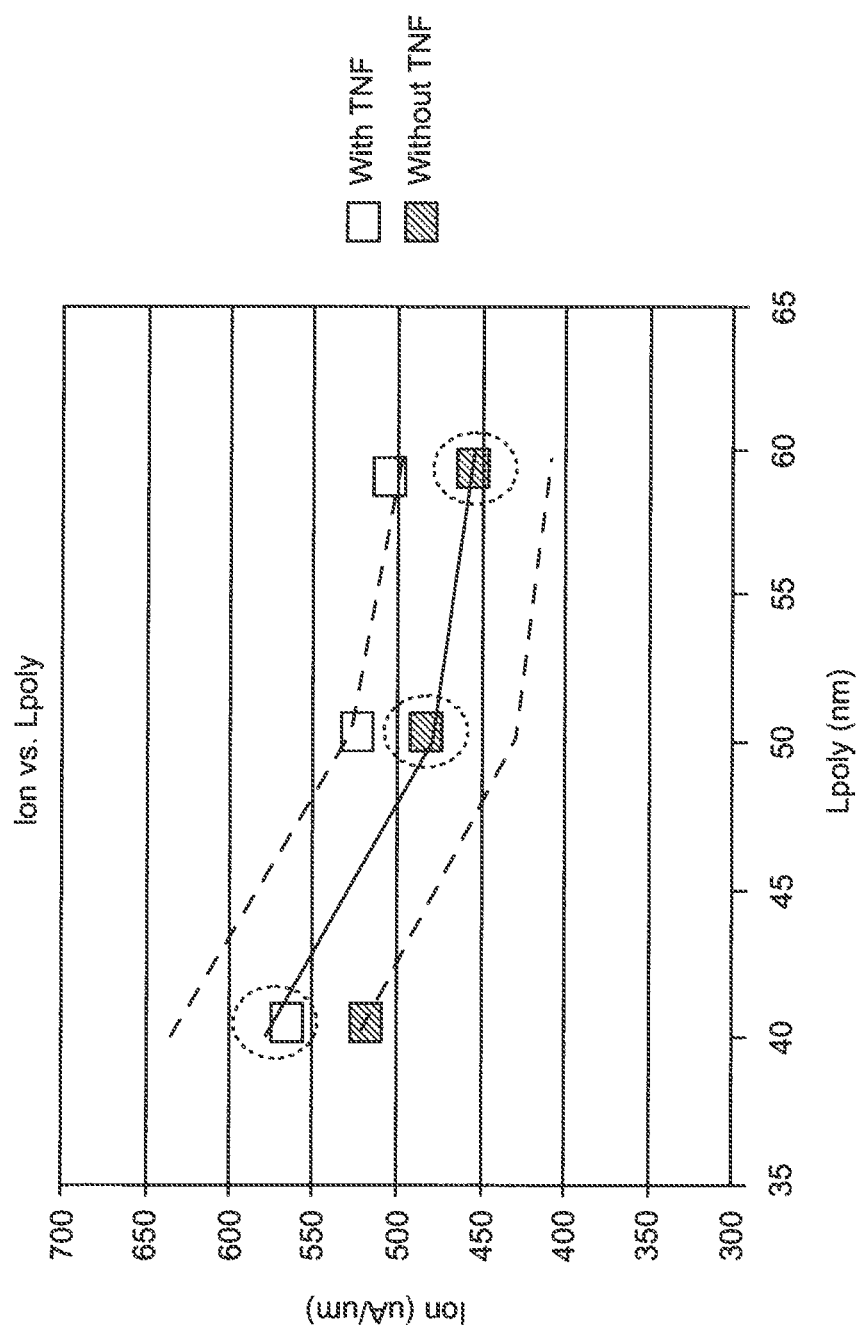

Conversely stated, as compared to the benchmark transistor design, $I_{off}$ of selected transistors having increased gate length, as discussed above in connection with FIGS. 1A and 2A, can be dramatically reduced while essentially having no effect on the intended electrical properties of the benchmark design transistors and a desired, specified $I_{off}$ can be closely approached for any desired gate length, as graphically illustrated in FIG. 3A. Further, even though electron mobility is reduced by removal of the tensile (e.g. nitride) film (which could theoretically be replaced) $I_{on}$ of low leakage transistors remains acceptably high while $I_{on}$ of benchmark design transistors is not affected, as graphically illustrated in FIG. 3B.

Figure 4A:
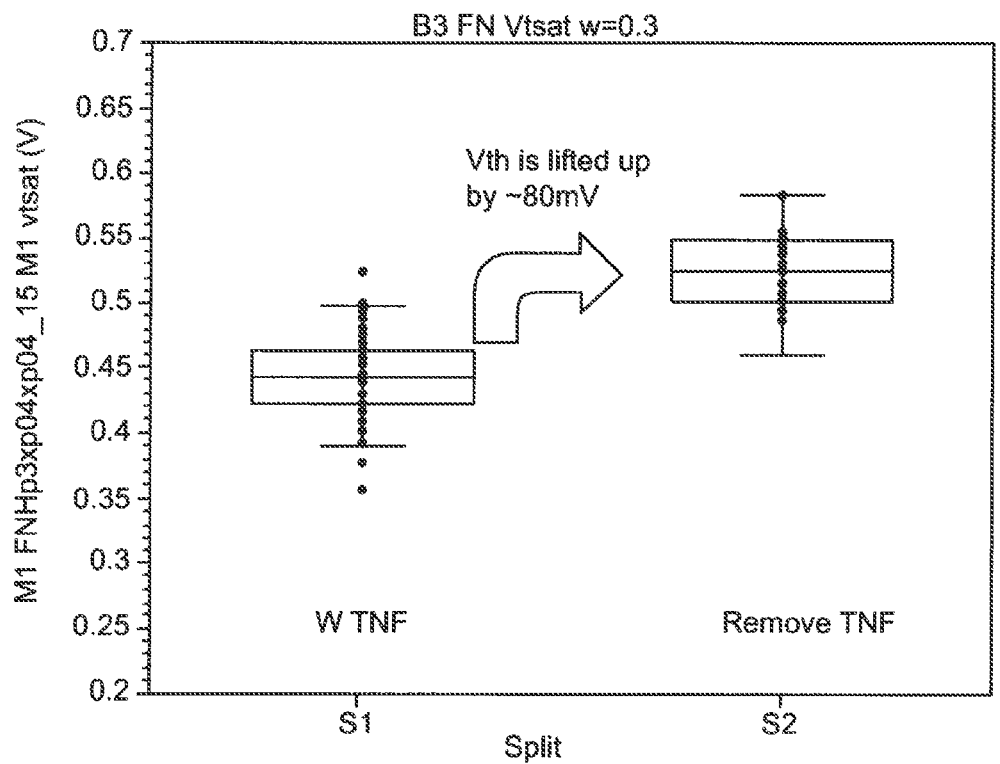
Figure 4B:
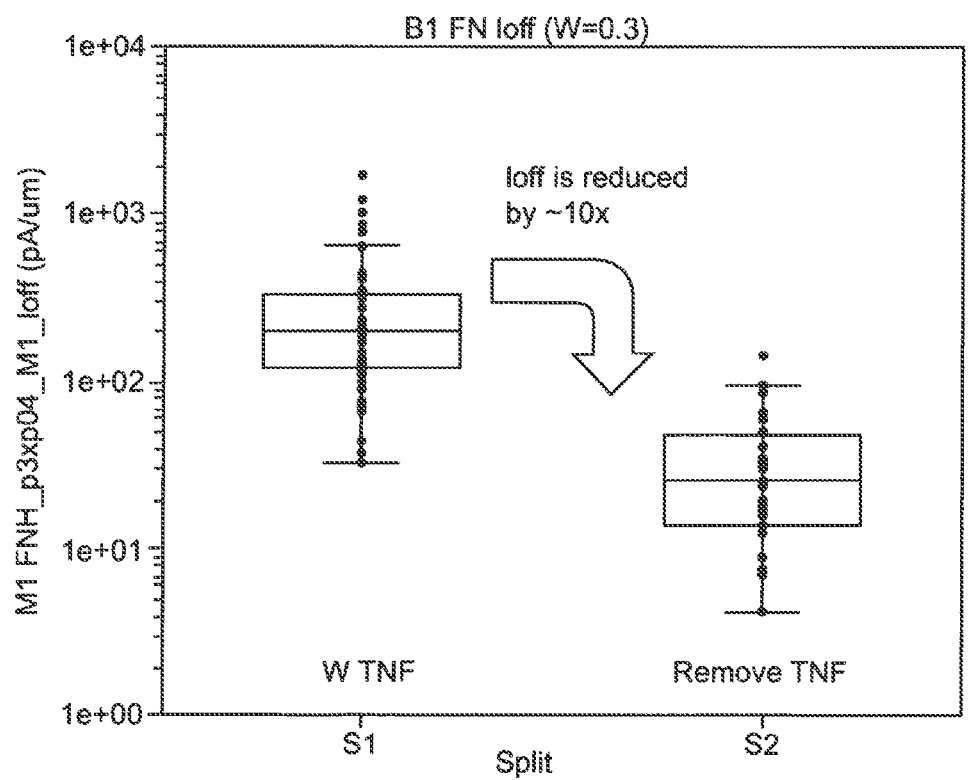

For transistors of the identical geometry as discussed above in connection with FIGS. 1B and 2B, as shown in FIG. 4A, the threshold voltage, $V_{th}$, can be raised substantially by as much as 80 mV due to removal of the out-diffusion sink. Further, as shown in FIG. 4B, by removal of the out-diffusion sink and substantially preventing boron out-diffusion from the halo implant, $I_{off}$ can be reduced by up to substantially an order of magnitude (e.g. by 90%).

Figure 5:
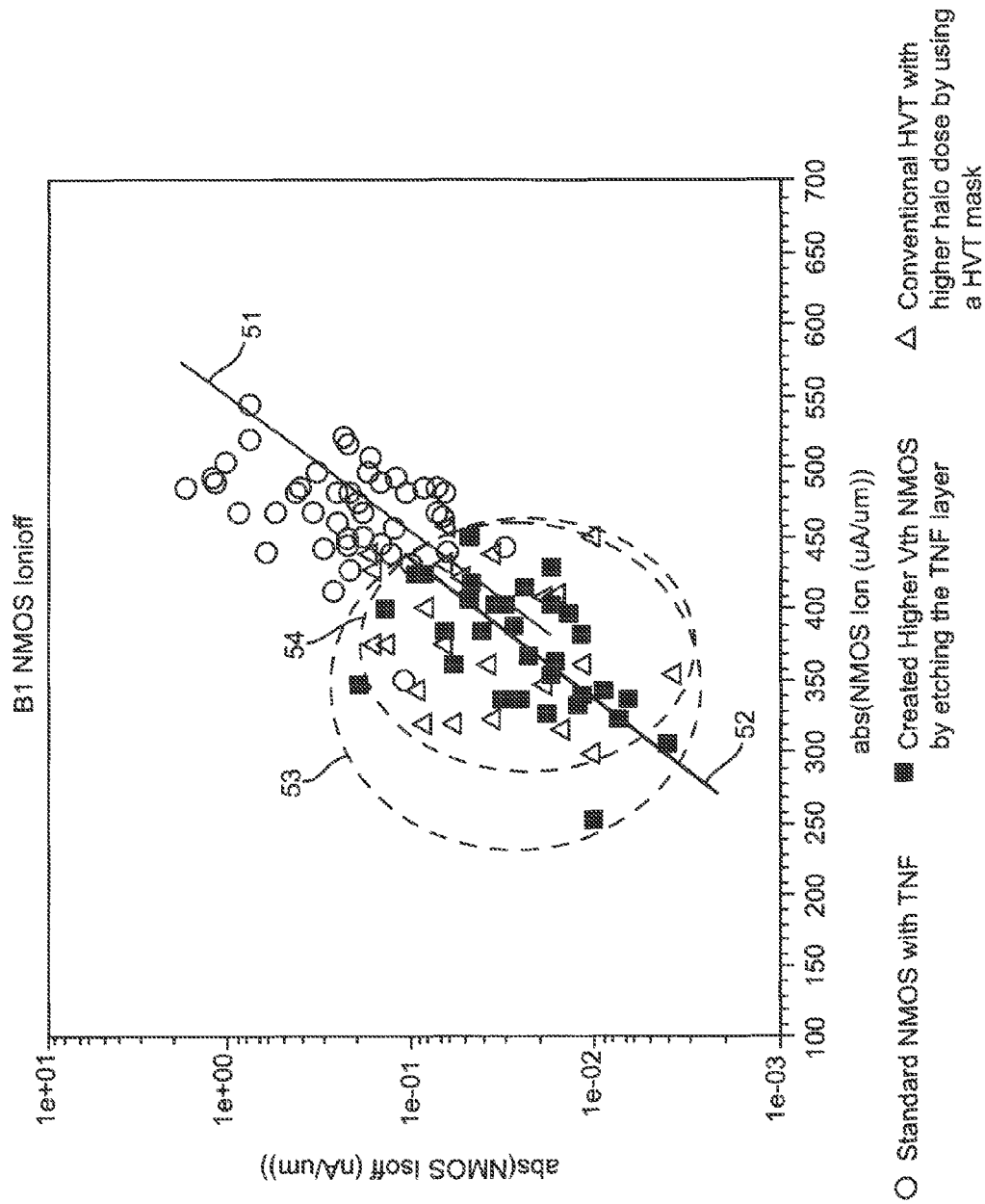
FIG. 5 is a graphical plot of $I_{on}$ versus $I_{off}$ comparing electrical characteristics of transistors obtained using the invention with electrical characteristics of transistors obtained with and without halo implants using a mask which may be omitted through employment of the invention.

FIG. 5 shows a plot of $I_{off}$ as a function of $I_{on}$ (e.g. corresponding to off/on resistance ratios) for transistors of various designs to compare the results of transistors formed in accordance with the invention to corresponding benchmark transistor designs and transistors formed using an additional mask to increase halo implant impurity concentrations have much reduced leakage. It can be clearly seen that both $I_{off}$ and $I_{on}$ are relatively large (corresponding to high leakage) for benchmark design transistors, as shown by line 51 but are reduced by virtue of the invention, as shown by line 52 indicating greatly reduced leakage. Moreover, the cluster of values developed in accordance with the invention, shown by dashed line 53, is entirely comparable to and possibly somewhat better than the values obtained by forming the transistors using an additional mask and implantation process to increase halo implant dose as in the prior art while eliminating a complex lithographic process which may compromise manufacturing yield.

In view of the foregoing, it is clearly seen that the invention provides a simplified and more economical process for formation of low leakage transistors using substantially the same processes used for benchmark transistors in integrated circuits of arbitrary design and which are essentially required for acceptable performance and operation of low-power integrated circuits. Further, the invention provides for achieving much different electrical characteristics of transistors having substantially identical geometry and structures on a single chip and using a common process sequence. It should be understood that while the use of a tensile film as an out-diffusion sink is the most economical, advantageous and convenient application of the invention presently contemplated by the inventors, the stress level in the film/out-diffusion sink is of no importance to the successful practice of the invention and any film or material deposit that can be modified/removed at selected transistor sites can be used as an out-diffusion sink. It should also be appreciated that the invention, in accordance with its most basic principles, is not limited to alteration of electrical characteristics of NMOS transistors or boron but can be employed in regard to any impurity exhibiting a relatively high diffusion rate and any structure including such an impurity, such as in extension implants adjacent source and drain structures of PMOS transistors which typically include boron and where impurities of lower diffusivity (e.g. phosphorus and/or arsenic) are used for halo implants. In this regard, the invention may be useful in limiting diffusion of boron within a transistor channel by providing a diffusion sink into which higher diffusivity impurities may preferentially out-diffuse.

While the invention has been described in terms of two embodiments illustrating general applicability of the invention to all transistor and integrated circuit designs, those skilled in the art will recognize that the invention can be practiced with modification within the spirit and scope of the appended claims.

Having thus described my invention, what I claim as new and desire to secure by Letters Patent is as follows:

1. An integrated circuit including
   a plurality of transistors of benchmark design of a first conductivity type, each said transistor of said benchmark design including a stressed layer or film applying stress on a channel of said transistor of benchmark design to cause increased electron mobility in said channel, said stressed film also causing out-diffusion of impurities from said channel such that no halo implant is formed therein; and
   at least one transistor of a different design of said first conductivity type exhibiting reduced leakage and increased threshold voltage compared with said plurality of transistors of benchmark design, said at least one transistor of a different design having a channel region with a higher concentration of impurities than channels regions of said plurality of transistors of benchmark design, wherein said higher concentration forms a halo implant in said channel region of said at least one transistor of a different design,
   wherein a total impurity dose in a channel region of a transistor of said benchmark design and in material adjacent said channel region of said transistor of said benchmark design and a total impurity dose in a channel region of said at least one transistor of said different design are substantially equal but differently distributed such that halo implants are present in said channel region of said at least one transistor of different design but not present in channel regions of said plurality of transistors of said benchmark design, such that a total impurity dose within each channel region of said plurality of transistors of benchmark design is less than said total impurity dose in said channel region of said at least one transistor of said different design and such that a total impurity content of said integrated circuit is substantially equal to the a total impurity content required to form halo implants in all transistors of both said benchmark design and different design.

2. The integrated circuit as recited in claim 1, wherein said transistor of said benchmark design includes said stressed layer or film overlying a portion of a said transistor of benchmark design.

3. The integrated circuit as recited in claim 2, wherein said stressed layer or film is a tensile film.

4. The integrated circuit as recited in claim 3, wherein said tensile film is a tensile nitride film.

5. The integrated circuit as recited in claim 1, wherein said plurality of transistors of said benchmark design have a nominal channel length of 40 nm.

6. The integrated circuit as recited in claim 5, wherein said at least one transistor of said different design exhibiting reduced leakage has a channel length in excess of 40 nm.

7. The integrated circuit as recited in claim 5, wherein said at least one transistor of said different design exhibiting reduced leakage has a nominal channel length of 40 nm.

8. The integrated circuit as recited in claim 1, wherein said plurality of transistors of benchmark design and said at least one transistor of said different design exhibiting reduced leakage are NMOS transistors.

9. The integrated circuit as recited in claim 1, wherein said impurities include boron.

10. The integrated circuit as recited in claim 1, further including
    a plurality of transistors of a second conductivity type.

* * * * *